(12) United States Patent
Zhu et al.

(10) Patent No.: US 11,502,152 B2
(45) Date of Patent: Nov. 15, 2022

(54) DISPLAY APPARATUS AND PREPARATION METHOD THEREOF

(71) Applicant: BOE Technology Group Co., Ltd., Beijing (CN)

(72) Inventors: Haibin Zhu, Beijing (CN); Zhongyuan Sun, Beijing (CN); Guangcai Yuan, Beijing (CN); Weijie Wang, Beijing (CN); Bo Jiang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 485 days.

(21) Appl. No.: 16/484,623

(22) PCT Filed: Mar. 6, 2019

(86) PCT No.: PCT/CN2019/077186
§ 371 (c)(1),
(2) Date: Aug. 8, 2019

(87) PCT Pub. No.: WO2020/057063
PCT Pub. Date: Mar. 26, 2020

(65) Prior Publication Data
US 2021/0408197 A1     Dec. 30, 2021

(30) Foreign Application Priority Data
Sep. 18, 2018 (CN) .......................... 201811087036.2

(51) Int. Cl.
*H01L 27/32* (2006.01)
*H01L 25/065* (2006.01)

(52) U.S. Cl.
CPC ...... *H01L 27/3276* (2013.01); *H01L 25/0655* (2013.01); *H01L 27/3218* (2013.01); *H01L 2227/323* (2013.01)

(58) Field of Classification Search
CPC ............ H01L 27/3276; H01L 25/0655; H01L 27/3218; H01L 2227/323
(Continued)

(56) References Cited

U.S. PATENT DOCUMENTS 10,146,377 B2   12/2018   Park et al.
10,234,975 B2   3/2019   Zhai
(Continued)

FOREIGN PATENT DOCUMENTS

CN     105700758 A     6/2016
CN     105895662 A     8/2016
(Continued)

OTHER PUBLICATIONS

Office Action dated Nov. 13, 2020, issued in counterpart CN Application No. 201811087036.2, with English Translation. (13 pages).
(Continued)

*Primary Examiner* — Didarul A Mazumder
(74) *Attorney, Agent, or Firm* — WHDA, LLP (57) ABSTRACT

The present disclosure relates to a display apparatus. The display apparatus may include a plurality of display units, each of the plurality of display units including at least one pixel, and a plurality of connectors that connect the plurality of display units to one another. The plurality of connectors and the plurality of display units may form a mesh distribution structure and, when the mesh distribution structure is stretched in a first direction, the mesh distribution structure may be configured to expand in a second direction perpendicular to the first direction.

17 Claims, 9 Drawing Sheets

(58) Field of Classification Search
USPC .................................... 257/40; 438/82, 99
See application file for complete search history.

(56) References Cited

U.S. PATENT DOCUMENTS

| | | |
|---|---|---|
| 2016/0293571 A1 | 10/2016 | Yoon et al. |
| 2016/0306486 A1 | 10/2016 | Kim |
| 2017/0221982 A1* | 8/2017 | Park .................... H01L 51/0097 |
| 2018/0046221 A1* | 2/2018 | Choi .................. G02B 26/0825 |
| 2018/0253175 A1 | 9/2018 | Yao |

FOREIGN PATENT DOCUMENTS

| | | | |
|---|---|---|---|
| CN | 106816460 A | 6/2017 | |
| CN | 106952938 A | 7/2017 | |
| CN | 107221549 A | 9/2017 | |
| CN | 107230429 A | 10/2017 | |

OTHER PUBLICATIONS

International Search Report dated Jun. 19, 2019, issued in counterpart Application No. PCT/CN2019/077186 (10 pages).

* cited by examiner

DISPLAY APPARATUS AND PREPARATION METHOD THEREOF

CROSS-REFERENCE TO RELATED APPLICATIONS

This application claims benefit of the filing date of Chinese Patent Application No. 201811087036.2 filed on Sep. 18, 2018, the disclosure of which is hereby incorporated in its entirety by reference.

TECHNICAL FIELD

The present disclosure relates to display technology, and in particular, to a display apparatus and a method of fabricating the same.

BACKGROUND

Some display apparatuses are capable of outputting visual information to a user. Some display apparatuses are also capable of receiving input commands from the user. With the advancement of display technology, flexible, foldable, and stretchable display apparatuses have appeared and been applied to various electronic apparatuses.

BRIEF SUMMARY

An embodiment of the present disclosure provides a display apparatus. The display apparatus may include a plurality of display units, each of the plurality of display units including at least one pixel, and a plurality of connectors that connect the plurality of display units to one another. The plurality of connectors and the plurality of display units form a mesh distribution structure and, when the mesh distribution structure is stretched in a first direction, the mesh distribution structure is configured to expand in a second direction perpendicular to the first direction.

Optionally, the plurality of display units are arranged in a rectangular army, and four adjacent display units disposed in two adjacent rows and two adjacent columns of the rectangular array among the plurality of display units and connectors connecting the four adjacent display units to one another constitute a mesh cell of the mesh distribution structure.

Optionally, the connectors connecting the four adjacent display units to one another comprise a first group of connectors comprising connectors that are arranged opposite from each other in a row direction of the rectangular array and a second group of connectors comprising correctors that are arranged opposite from each other in a column direction of the rectangular array.

Optionally, each connector of the first group of connectors is configured to form a convex shape toward the other connector on the opposite side, and each connector of the second group of connectors is configured to form a concave shape away from the other connector on the opposite side.

Optionally, each connector of the second group of connectors is configured to form a convex shape toward the other connector on the opposite side, and each connector of the first group of connectors is configured to form a concave shape away from the other connector on the opposite side.

Optionally, the first group of connectors and the second group of connectors among a group of four adjacent display units form a vertical dumb-bell-shaped mesh cell, and the first group of connectors and the second group of connectors among another group of four adjacent display units form a horizontal dumb-bell-shaped mesh cell, and the vertical dumb-bell-shaped mesh cell and the horizontal dumb-bell-shaped mesh cell alternately appear in a row direction and in a column direction of the rectangular array.

Optionally, each connector of the first group of connectors and the second group of connectors has a shape of a circular arc.

Optionally, the four adjacent display units and the respective connectors connecting the four adjacent display units to one another are axially symmetric with respective to a center line of the four adjacent display units in the row direction of the rectangular array. The four adjacent display units and the respective connectors connecting the four adjacent display units to one another are axially symmetric with respect to a center line of the four adjacent display units in the column direction of the rectangular array.

Optionally, each of connectors connecting to a display unit among the four adjacent display units is configured to curve in a clockwise or counterclockwise direction away from the respective display unit to form a circular arc.

Optionally, the mesh distribution structure is configured to expand by a substantially equal amount in the second direction as in the first direction when the mesh distribution structure is stretched in the first direction.

Optionally, the plurality of display units is formed on a substrate, and the plurality of connectors and the substrate form an integral structure.

Optionally, the mesh cell in the mesh distribution structure comprises a hollow structure.

Optionally, a cross-sectional width of at least one connector among the plurality of connectors gradually decreases from at least one end of the respective connector toward a center of the respective connector.

Optionally, a connecting portion of the at least one end of the connector to the display unit forms a circular arc.

Optionally, a cross-sectional width of at least one connector among the plurality of connectors remains substantially same from at least one end of the respective connector toward a center of the respective connector.

Optionally, the plurality of display units comprise at least one selected from the group consisting of organic light emitting diodes and quantum dot light emitting diodes.

Optionally, at least one of the plurality of display units has a square shape. Each side of the square shape is parallel to a row direction or a column direction of the rectangular array respectively Optionally, at least one of the plurality of display units has a square shape. Each side of the square shape is tilted at an angle with respect to a row direction or a column direction of the rectangular array respectively.

Optionally, at least one of the plurality of the display units has a circular shape.

One example of the present disclosure is a method of fabricating the display apparatus. The method of fabricating the display apparatus may include providing a substrate; and forming the plurality of display units and the plurality of connectors connecting the plurality of the display units to one another in accordance with the mesh distribution structure on the substrate.

Optionally, the forming the plurality of the display units and the plurality of connectors comprises forming thin film transistors of the plurality of display units and signal lines connecting the thin film transistors in accordance with the mesh distribution structure on the substrate; etching or laser cutting the substrate to form a plurality of mesh cells in the mesh distribution structure; and forming a light-emitting layer on each of the thin film transistors.

Optionally, the display units and the connectors are formed by etching or laser cutting the same substrate or the display units and the connectors are formed independently and then connected to each other after being formed.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

It should be understood that the dimensions of the various parts shown in the figures are not drawn in the actual scale. Further, the same or similar reference numerals denote the same or similar components.

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-9. When referring to the figures, like structures and elements shown throughout are indicated with like reference numerals.

Unless otherwise defined, any technical or scientific term used herein shall have the common meaning understood by a person of ordinary skill in the art. Words such as "first" and "second" used in the specification and claims are merely used to differentiate different components rather than to represent any order, number or importance of the components. Similarly, such word as "including" or "comprising" are merely used to represent that the element or unit presented prior to the word contains elements, units and the like enumerated subsequent to the word, instead of excluding other elements or units. "Up," "down," "left," "right," and so on are used only to represent the relative positional relationship. When the absolute position of the object to be described changes, the relative positional relationship may also change accordingly.

In the present disclosure, when describing a particular apparatus being located between a first apparatus and a second apparatus, an intermediate apparatus may exist between the particular apparatus and the first apparatus or the second apparatus, and the intermediate apparatus also may not exist When describing the particular apparatus being connected with other apparatuses, the particular apparatus can be directly connected with the other apparatuses without an intermediate apparatus, or it can be indirectly connected with the other apparatuses by having an intermediate apparatus.

Unless otherwise defined, all the terms (including the technical and scientific terms) used herein have the same meanings as commonly understood by one of ordinary skill in the art to which the present disclosure is directed. It is also understood that the terms such as defined in the usual dictionary should be interpreted as having the same meanings as the meaning in the context of the relevant technology. The terms should not be interpreted as an idealization or as having extreme meanings, unless they are explicitly defined herein.

Techniques, methods and apparatus as known by one of ordinary skill in the relevant art may not be discussed in detail but are intended to be part of the specification where appropriate.

Flexible display apparatuses can achieve a certain degree of stretchability. When the flexible display apparatus is stretched in one direction, the spacing between the pixels in that direction becomes larger, thereby causing a lower resolution. At the same time, the spacing between the pixels in the direction perpendicular to the one direction becomes smaller, thereby causing a higher resolution. Thus, when the flexible display apparatus is being stretched, the resolution over the whole flexible display apparatus becomes relatively uneven, thereby causing significant image distortion.

In view of the above, the present disclosure provides a display apparatus and a method of fabricating the same that can reduce the unevenness of resolution when the display apparatus is stretched.

Figure 1:
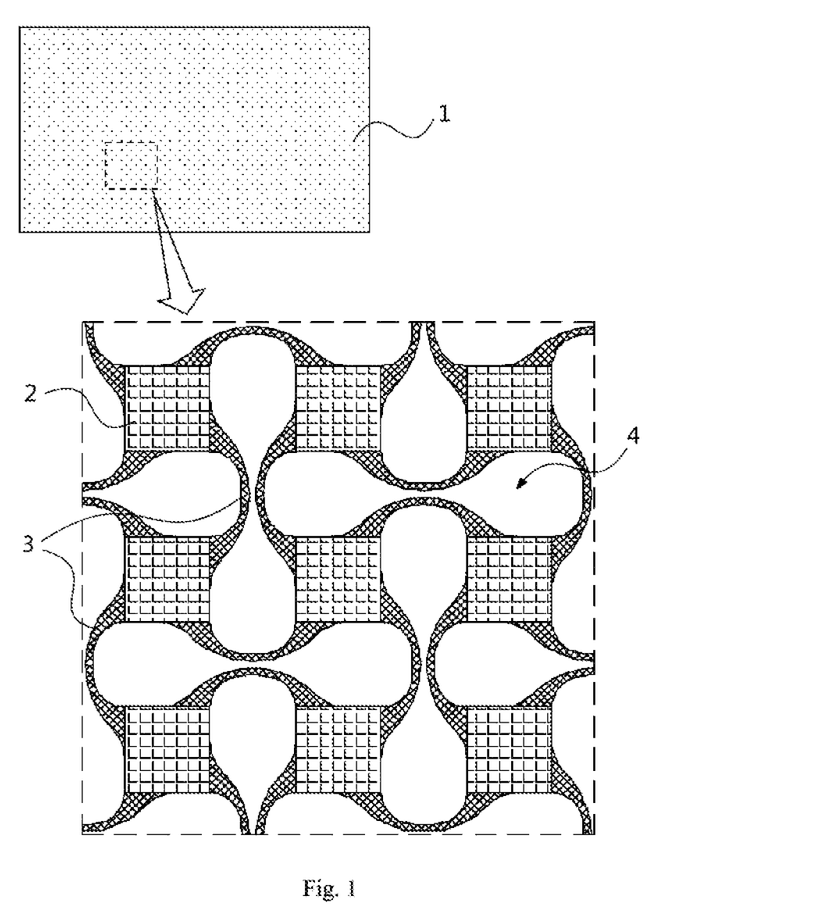
FIG. 1 is a schematic diagram of a display apparatus according to one embodiment of the present disclosure.

FIG. 1 is a schematic diagram of a display apparatus according to one embodiment of the present disclosure. As shown in FIG. 1, the display apparatus 1 includes a plurality of display units 2 and a plurality of connectors 3. Each of the display units 2 includes one or a plurality of pixels to realize the display function. In one embodiment, the display units 2 include organic light emitting diodes (OLED). In one embodiment, the display units include, for example, light emitting diodes (LED) or quantum dot light emitting diodes (QLED) . . . etc.

In some embodiments, the connectors 3 are arranged among the plurality of display units 2 and are connected to the plurality of display units 2 to form a mesh distribution structure, which includes a plurality of mesh cells. In other words, each display unit 2 corresponds to a respective node in the mesh distribution structure, and each connector 3 corresponds to the connection between the nodes. FIG. 1 shows at least a partial region of the display apparatus 1, which can be enlarged to illustrate the mesh distribution structure as shown in FIG. 1.

In some embodiments of the present disclosure, when the mesh distribution structure formed by the plurality of the connectors 3 and the plurality of display units 2 is stretched in a first direction, the mesh distribution structure also expands in a second direction that is perpendicular to the first direction. By adopting this mesh distribution structure, when the display apparatus is stretched in one direction, the display apparatus simultaneously expands in the direction perpendicular to the one direction. Therefore, when the display apparatus is stretched, the resolutions of the two directions are synchronously reduced, and the degree of unevenness of the resolution across the display apparatus is reduced, thereby reducing the image distortion. When the external tensile force of the display apparatus is removed, the mesh distribution structure is synchronously contracted in the two directions so that the resolutions of the two directions are synchronously increased. Therefore, the resolution of the display apparatus in the process of restoring to its original state is relatively even and the image is not significantly distorted.

In some embodiments, a first direction and a second direction in a mesh distribution structure in a two-dimensional plane is herein referred to directions as mutually perpendicular in the two-dimensional plane. In order to make the resolution of the display apparatus even, the mesh distribution structure expands in an equal amount in the first direction and in the second direction when the display apparatus is stretched.

In some embodiments, the connectors 3 are integrally formed with the plurality of display units 2 on the substrate. That is, a same base material is used for the substrate of the display units 2 and for the connectors 3. The base material is selected from organic materials that have good elasticity and ductility, such as polyimide, polyethylene terephthalate, or modified materials derived from these materials. In one embodiment, the substrate of the display units 2 and the connectors 3 are formed by etching or laser cutting a same substrate material. In some embodiments, the display units 2 and the connectors 3 are formed independently and then connected with one another afterwards.

In some embodiments, in order to give the mesh distribution structure more expandability, each mesh cell 4 in the mesh distribution structure includes a hollowed structure. This way, the restriction of the movement and stretching of the connectors 3 caused by internal structure of the mesh cell is eliminated. In some embodiments, the mesh cell 4 does not have a hollow structure, but instead has a thinner substrate structure, for example.

In some embodiments, in order to transmit a power supply signal or a control signal among the plurality of display units 2, a signal line is disposed in the connector 3 to transmit and receive signals between the adjacent display units 2 to which the connector 3 is connected. The signal line is arranged along the direction of extension of the connector 3. For example, adjacent thin film transistors (TFT) are connected by the signal line. The signal line is disposed in the connector 3 or attached to the surface of the connector 3. The signal line may be formed of conductive materials such as metal wires, nanotubes, nanowires, or conductive traces.

Figure 2:
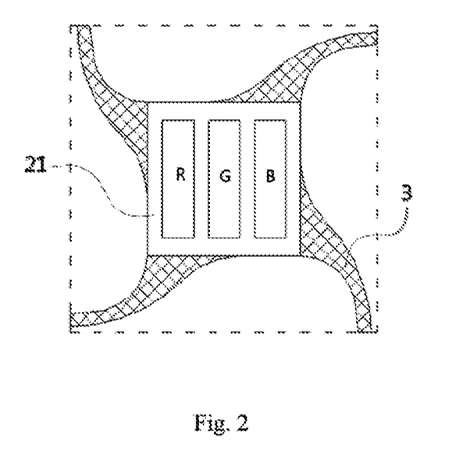
FIG. 2 is a schematic structural view of a display unit according to one embodiment of the present disclosure.
Figure 3:
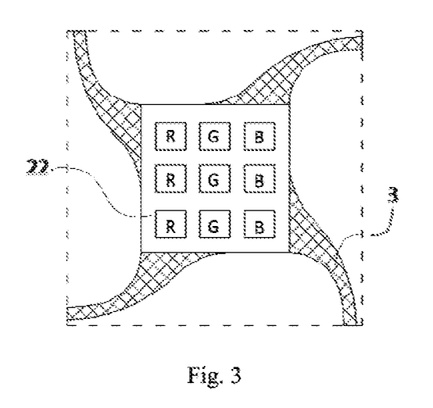
FIG. 3 is a schematic structural view of a display unit according to one embodiment of the present disclosure.

FIGS. 2 and 3 are schematic structural views of a display unit in two respective embodiments according to the present disclosure.

In some embodiments, as shown in FIG. 2, the display unit 21 includes a single OLED that emits a specific wavelength, or an OLED that emits red, green, blue or white light. As shown in FIG. 3, in some embodiments, the display unit 22 includes a plurality of OLEDs that emit a specific wavelength, or a plurality of OLEDs that emit red, green, blue or white light.

In some embodiments, the OLED in each display unit 21 includes a TFT to drive the pixel of the display unit 21. In some embodiments, the display unit includes a top-emitting display component, a bottom-emitting display component, or a transparent display component. In some embodiments, the display unit includes a thin film encapsulation layer to encapsulate the display component.

In some embodiments, the display apparatus includes a plurality of display units 21, a plurality of display units 22, or a plurality of display units 21 and a plurality of display units 22.

Figure 4:
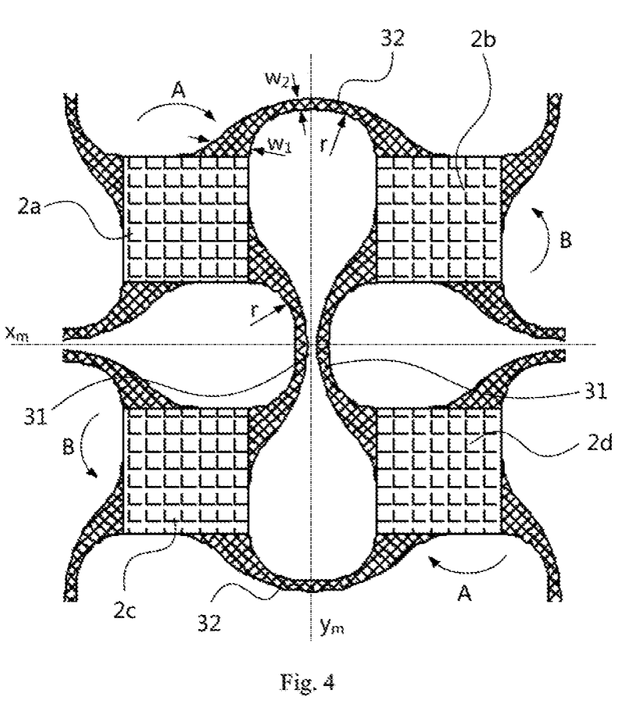
FIG. 4 is a schematic diagram of a connection structure formed by four adjacent display units according to one embodiment of the present disclosure.

FIG. 4 is a schematic diagram of a connection structure of any four adjacent display units of a display apparatus according to some embodiments of the present disclosure.

As shown in FIGS. 1 and 4, in some embodiments, the mesh distribution structure includes a plurality of display units arranged in a rectangular array. Any four adjacent display units arranged in two adjacent columns and two adjacent rows of the rectangular array and the plurality of connectors that connect the four adjacent display units to one another form a mesh cell 4 of the mesh distribution structure. The four adjacent display units include: any display unit among the plurality of display units in the stretchable apparatus (referred to as the first display unit 2a), a second display unit 2b that is adjacent to the first display unit 2a in the row direction of the rectangular array, a third display unit 2c that is adjacent to the first display unit 2a in the column direction of the rectangular array, and a fourth display unit 2d that is adjacent and diagonal to the first display unit 2a.

In some embodiments, any display unit among the group of four adjacent display units is also a part of another group of four adjacent display units. The rows and columns in the rectangular array and the sorting relationship of the display units can be selected and exchanged based on the reference coordinate system. It should be noted that the arrangement of the plurality of display units is not limited to a rectangular array. Other array arrangements such as a diamond array, a wave array, and the like can also be adopted. However, for a display apparatus having the plurality of display units arranged in a rectangular array, the resolution is usually mom even when the display apparatus is stretched.

The following describes exemplary models of the plurality of display units arranged in a rectangular array. The connectors among four adjacent display units as shown in FIG. 4 are grouped according to the row direction and the column direction of the rectangular array. That is, the connector includes: a first group of connectors and a second group of connectors. The first group of connectors includes connectors 31 that are oppositely arranged along the row direction of the rectangular array. The second group of connectors includes connectors 32 that are oppositely arranged along the column direction of the rectangular array.

As shown in FIG. 4, any one of the connectors 31 of the first group of connectors is configured to form a convex shape toward the other connector 31 on the opposite side. Any one of the connectors 32 of the second connector group is configured to form a concave shape away from the other connector 32 on the opposite side. The first group of connectors and the second group of connectors among the four adjacent display units form a vertical dumb-bell-shaped mesh cell. In another group of four adjacent display units, any one of the connectors 3 in the second group of connectors is configured to form a convex shape toward the other connector 3 on the opposite side. Any one of the connectors of the first group of connectors is configured to form a concave shape away from the other connector 3 on the opposite side. The first group of connectors and the second group of connectors among the second group of four adjacent display units form a horizontal dumb-bell-shaped mesh cell.

In some embodiments, when the above-described mesh distribution structure is subjected to a tensile force in one direction (e.g., a transverse tensile force), the connectors in the first group of connectors and the second group of connectors are gradually straightened and flattened, thereby allowing the display apparatus to be expanded in the stretching direction while simultaneously being expanded in the direction perpendicular to the stretching direction. This way, the variation between spacing of the display units along the two directions is decreased, thereby effectively reducing the unevenness of the resolution when the display apparatus is stretched and accordingly solving the image distortion problem.

In some embodiments, as shown in FIG. 4, each of the connectors 31 in the first group of connectors is in the shape of a circular arc. Each of the connectors 32 in the second group of connectors is also in the shape of a circular arc. In some embodiments, the connector has a polygonal or wavy shape. When the mesh distribution structure including the arc-shaped concave or convex connectors is subjected to a tensile force in one direction, the amount of expansion in the direction perpendicular to the one direction is substantially the same or equal to the amount of expansion in the one direction. As such, the resolution of the display apparatus is more uniform when stretched, and the image distortion problem is solved.

In some embodiments, in order to achieve a better consistency of the display apparatus when it is stretched, the four adjacent display units and their respective connectors as shown in FIG. 4 are axially symmetric with respect to the center line $y_m$ of the four adjacent display units in the row direction of the rectangular array. The four adjacent display units and their respective connectors are also axially symmetric with respect to the center line $x_m$ of the four adjacent display units in the column direction of the rectangular array.

In some embodiments, as shown in FIG. 4, each of the connectors connecting to any one of the four adjacent display units is curved in a clockwise or counterclockwise direction away from the display unit to which it is connected. As shown in FIG. 4, four connectors are connected to the first display unit 2a and each of the four connectors is curved in a clockwise direction A to form a circular arc shape. The second display unit 2b is connected to four connectors and each of the four connectors is curved in a counterclockwise direction B to form a circular arc shape. The third display unit 2c is connected to four connectors and each of the four connectors is curved in the counterclockwise direction B to form a circular arc shape. The fourth display unit 2d is connected to four connectors and each of the four connectors is curved in the clockwise direction A to form a circular arc shape.

In some embodiments, through the connecting mode of connectors of each respective display unit and the axisymmetric relationship of each group of the respective four adjacent display units, a vertical dumb-bell-shaped mesh cell and a horizontal dumb-bell-shaped mesh cell alternately appear in the row direction and in the column direction of the rectangular array. When the mesh distribution structure including the plurality of mesh cells is subjected to a tensile force in one direction, the amount of expansion in the vertical direction to the one direction is more synchronous with the amount of expansion in the one direction. Therefore, the resolution of the display apparatus changes more uniformly, and the image is less significantly distorted when the display apparatus is stretched.

In some embodiments, considering that stress non-uniformity may cause breakage of a connector when the connector is pulled, it is provided that the cross-sectional width of the connector gradually decreases from at least one end of the connector to the center of the connector. As shown in FIG. 4, the uppermost connector 32 has a wider cross-sectional width w1 near the connecting portion of the display unit 2a, and the cross-sectional width decreases gradually from the end to the central position of the connector 32, which has a smaller cross-sectional width w2. The change in the cross-sectional width is in accordance with the stress distribution of the connector so as to avoid the risk of breakage caused by stress non-uniformity. Thereby, performance loss of the display apparatus due to damage to the signal line that is located in the connector is also avoided.

In some embodiments, it is provided that the connecting portion of at least one end of the connector 3 to the display unit 2 includes a circular arc segment, as shown in FIG. 4. That is, the connecting portion has a fillet. Through the circular arc segment, the problem of excessive stress concentration is significantly eliminated and accordingly, the durability and reliability of the display apparatus is improved.

Figure 5:
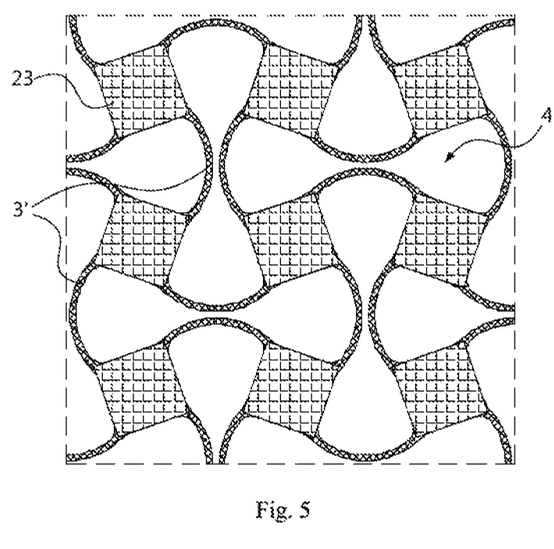
FIG. 5 is a schematic structure view of a display apparatus according to one embodiment of the present disclosure.
Figure 6:
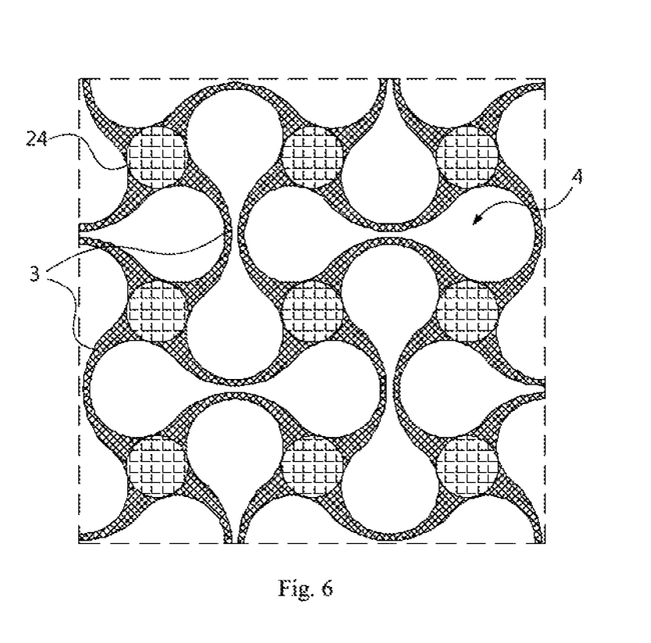
FIG. 6 is a schematic structure view of a display apparatus according to one embodiment of the present disclosure.

FIG. 5 is a schematic structural view of a display apparatus according to one embodiment of the present disclosure. FIG. 6 is a schematic structural view of a display apparatus according to another embodiment of the present disclosure.

As shown in FIGS. 1, 5, and 6, the shape, size and setting angle of the display unit can be designed according to the display characteristics of the display apparatus. The connecting portion of the connector to the display unit and the shape of the connector may also be designed accordingly. For example, as shown in FIG. 1, each of the plurality of display units 2 arranged in a rectangular array has a square shape and each side of the display unit 2 is parallel to the row direction or the column direction of the rectangular array. Correspondingly, the connector 3 connected to the two adjacent display units assumes a dome shape.

In some embodiments, as shown in FIG. 5, the plurality of the display units 23 form a square array, and each side of the respective display units 23 is inclined at a predetermined angle with respect to the row direction or the column direction of the square array. Accordingly, the length and curvature of the connectors 3' that connects to two adjacent display units 23 can be increased so as to increase the stretchability of the display apparatus. According to the tensile force applied to the connectors 3', the connectors 3' can have substantially the same cross-sectional width along the length direction of the connectors.

In some embodiments, the plurality of display units 24 arranged in the rectangular array as shown in FIG. 6 have a circular shape. When connected to two adjacent display units 24, the connectors 3 are not easily affected by the shape of the display units 24. Therefore, the plurality of connectors 3 that are connected to the four adjacent display units 24 is capable of forming a more rounded mesh shape, thereby achieving better synchronous expansion performance.

In some embodiments, the shape of the display unit is not limited to the shapes listed in the above embodiments, and may be elliptical, polygonal or irregular, and the like.

Figure 7A:
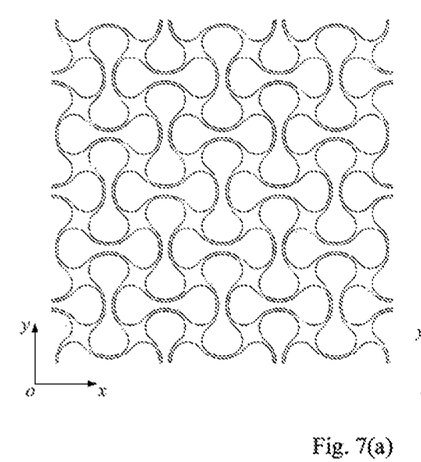
FIG. 7a is a schematic diagram of a display apparatus in a non-stretched state according to one embodiment of the present disclosure.
Figure 7B:
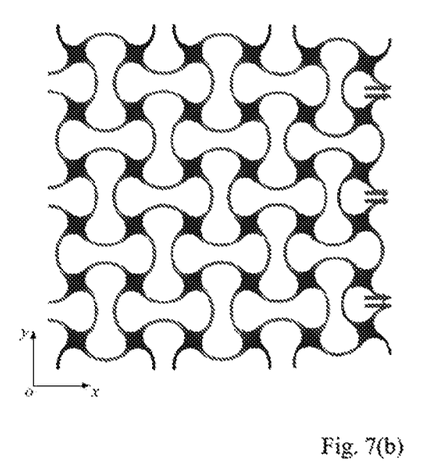
FIG. 7b is a schematic diagram of a display apparatus in a stretched state according to one embodiment of the present disclosure.
Figure 7C:
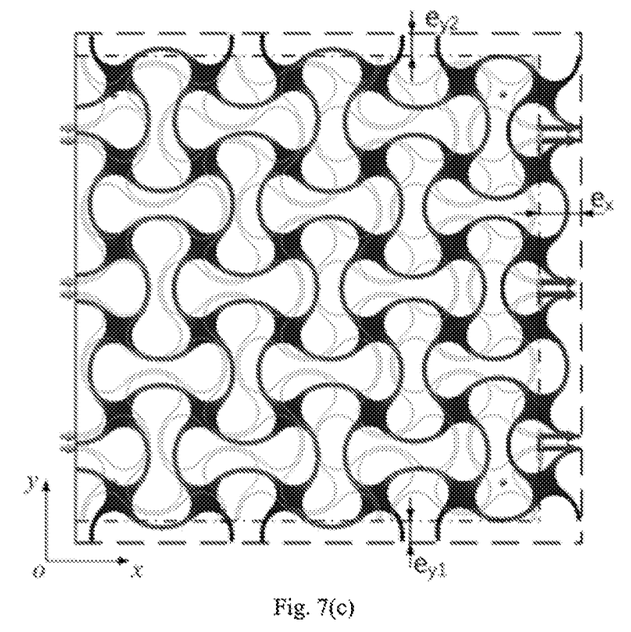
FIG. 7c illustrates an superimposed effect of a stretched state over the non-stretched state of the display apparatus according to one embodiment of the present disclosure.

FIG. 7(a) illustrates a simulation of a display apparatus in a non-stretched state according to one embodiment of the present disclosure. FIG. 7(b) illustrates a simulation of the display apparatus in a stretched state according to one embodiment of the present disclosure. FIG. 7(c) illustrates the effect of superimposed simulation of the display apparatus in the non-stretched state and in the stretched state.

The following is a simulation of the stretching process of the display apparatus according to some embodiments of the present disclosure. In the mesh distribution structure of the display apparatus as shown in FIG. 7(a), the connectors form vertical dumb-bell-shaped mesh cells and horizontal dumb-bell-shaped mesh cells which are alternately arranged along the x-axis and the y-axis of the array. Each connector at the waist of the vertical dumb-bell-shape mesh cell is the connector at the head of an adjacent horizontal dumb-bell-shape mesh cell. Each connector at the head of the vertical dumb-bell-shaped mesh cell is a connector at the waist of an adjacent horizontal dumb-bell-shaped mesh cell.

As shown in FIG. 7(b), when the display apparatus is subjected to a tensile force in the x-axis direction (i.e., the dark arrow on the right side of FIG. 7(b)), the connectors at the waist of each horizontal dumb-bell-shaped mesh cell are stretched to be straight by the tensile force in the x-axis direction and to be away from each other along the y-axis direction. The connectors at the waist of each vertical dumb-bell-shaped mesh cells are stretched to be away from each other along the x-axis direction by the tensile force and to be straight along the y-axis direction. Under this tensile force, the display apparatus exhibits an expanded state in both the x-axis and the y-axis directions, and the amounts of the expansion in the two directions are substantially the same.

FIG. 7(a) and FIG. 7(b) are superimposed in FIG. 7(c). FIG. 7(c) shows an expansion amount $e_x$ in the x-axis direction of the stretched display apparatus (indicated by a darker color) in comparison to the non-stretched display apparatus (indicated by a lighter color) and expansion amounts $e_{y1}$ and $e_{y2}$ in the y-axis direction, $e_x$ being substantially equal to the sum of $e_{y1}$ and $e_{y2}$. Therefore, in one embodiment, when the display apparatus is subject to a tensile force in the x-axis direction, the expansion amount in the x-axis and the y-axis directions are substantially the same. As a result, the resolution of the display unit changes evenly in these two directions. Accordingly, the image distortion problem is reduced and the image quality is improved.

Figure 8:
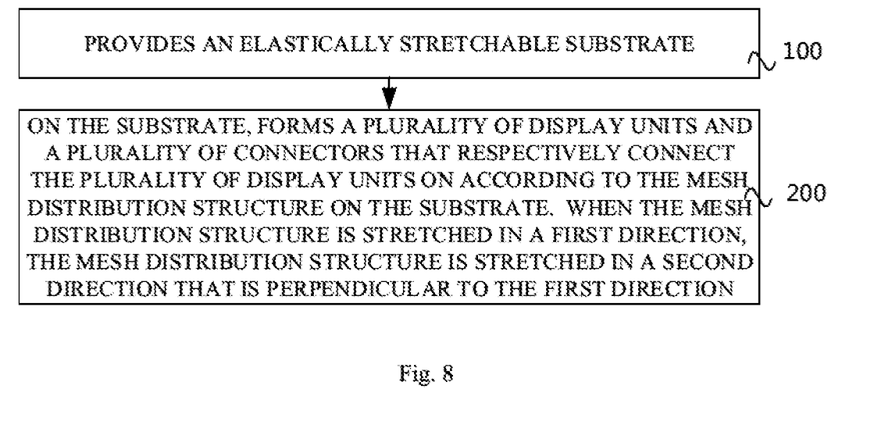
FIG. 8 is a flowchart of a method for fabricating a display apparatus according to one embodiment of the present disclosure.

FIG. 8 is a flow diagram of a method of fabricating a display apparatus according to one embodiment of the present disclosure.

In some embodiments, the method of fabricating the display apparatus includes steps 100 and 200 as shown in FIG. 8. Step 100 includes providing an elastically stretchable substrate. Step 200 includes, on the substrate, forming a plurality of display units and a plurality of connectors that respectively connect the plurality of display units in accordance with the mesh distribution structure, for example, as shown in FIG. 1. When the mesh distribution structure is stretched in a first direction, the mesh distribution structure is expanded in a second direction that is perpendicular to the first direction.

Figure 9:
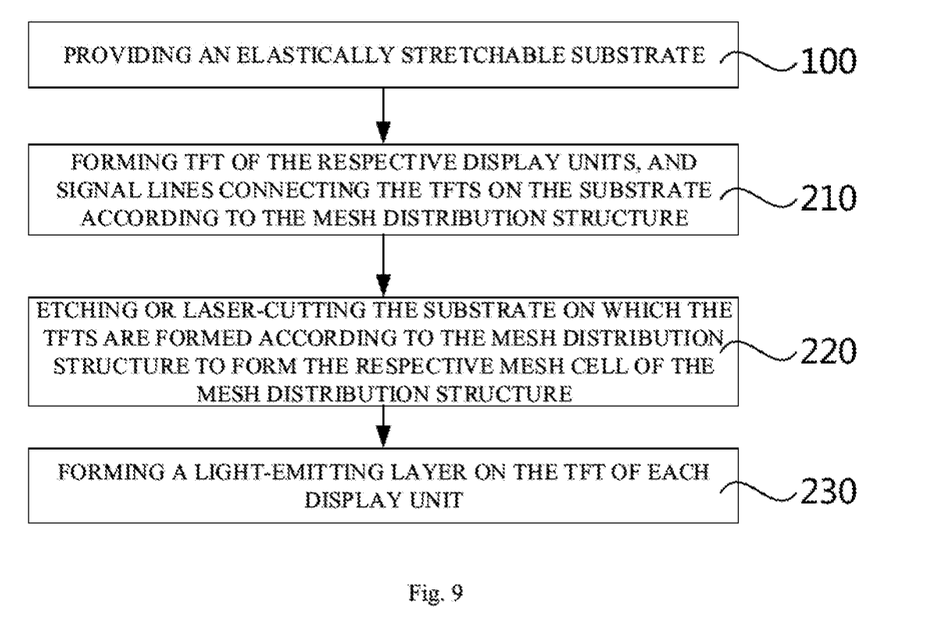
FIG. 9 is a flowchart of a method for fabricating a display apparatus according to one embodiment of the present disclosure.

FIG. 9 is a flow chart of a method of fabricating a display apparatus according to some embodiments of the present disclosure.

In comparison to the embodiment as shown in FIG. 8, step 200 in the embodiment of FIG. 9 specifically includes steps 210-230. In step 210, TFTs of the respective display units and signal lines connecting the TFTs are formed on the substrate according to the mesh distribution structure. In step 220, the substrate on which the TFTs are formed is etched or laser cut according to the mesh distribution structure to form the respective mesh cells of the mesh distribution structure. In step 230, a light-emitting layer such as an inorganic LED, an OLED, a QLED, or the like is formed on the TFT of each display unit. After step 230, a thin film encapsulation layer may also be formed on the light emitting layer.

The order of step 210 and step 220 may be reversed. That is, in some embodiments, the mesh cells may be etched according to the mesh distribution structure, and then the TFTs of the respective display units and the signal lines of the TFTs connecting the display units are formed on the substrate.

The embodiments in the present disclosure are described in a progressive manner, and the focus of each embodiment is different. For the same or similar parts present in various embodiments, one can refer to contents of the various embodiments. For the preparation method embodiment, since the whole method or the steps involved have a corresponding relationship with the content in a respective embodiment of the display apparatus, the description here is relatively simple, since one can refer to the description of the embodiments of the display apparatus for the relevant parts.

Hereto, various embodiments of the present disclosure have been described in detail. In order to avoid obscuring the concepts of the present disclosure, some details known in the art are not described. Those skilled in the art can fully understand how to implement the technical solutions disclosed herein according to the above description.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A display apparatus, comprising:
   a plurality of display units, each of the plurality of display units including at least one pixel; and
   a plurality of connectors that connect the plurality of display units to one another,
   wherein the plurality of connectors and the plurality of display units form a mesh distribution structure, the mesh distribution structure is configured to expand in a second direction perpendicular to the first direction in response that the mesh distribution structure is stretched in a first direction;
   wherein the plurality of display units are arranged in a rectangular array, and four adjacent display units disposed in two adjacent rows and two adjacent columns of the rectangular array among the plurality of display units and connectors connecting the four adjacent display units to one another constitute a mesh cell of the mesh distribution structure;
   wherein the connectors connecting the four adjacent display units to one another comprise:
   a first group of connectors comprising connectors that are arranged opposite from each other in a row direction of the rectangular array; and a second group of connectors comprising correctors that are arranged opposite from each other in a column direction of the rectangular array;

wherein each connector of the first group of connectors is configured to form a convex shape toward the other connector on the opposite side, and each connector of the second group of connectors is configured to form a concave shape away from the other connector on the opposite side; or wherein each connector of the second group of connectors is configured to form a convex shape toward the other connector on the opposite side, and each connector of the first group of connectors is configured to form a concave shape away from the other connector on the opposite side; and wherein the first group of connectors and the second group of connectors among a group of four adjacent display units form a vertical dumb-bell-shaped mesh cell, and the first group of connectors and the second group of connectors among another group of four adjacent display units form a horizontal dumb-bell-shaped mesh cell, and the vertical dumb-bell-shaped mesh cell and the horizontal dumb-bell-shaped mesh cell alternately appear in a row direction and in a column direction of the rectangular array.

2. The display apparatus according to claim 1, wherein each connector of the first group of connectors and the second group of connectors has a shape of a circular arc.

3. The display apparatus according to claim 1, wherein the four adjacent display units and the respective connectors connecting the four adjacent display units to one another are axially symmetric with respective to a center line of the four adjacent display units in the row direction of the rectangular array; and wherein the four adjacent display units and the respective connectors connecting the four adjacent display units to one another are axially symmetric with respect to a center line of the four adjacent display units in the column direction of the rectangular array.

4. The display apparatus according to claim 1, wherein each of connectors connecting to a display unit among the four adjacent display units is configured to curve in a clockwise or counterclockwise direction away from the respective display unit to form a circular arc.

5. The display apparatus according to claim 1, wherein the mesh distribution structure is configured to expand by a substantially equal amount in the second direction as in the first direction when the mesh distribution structure is stretched in the first direction.

6. The display apparatus according to claim 1, wherein the plurality of display units is formed on a substrate, and the plurality of connectors and the substrate form an integral structure.

7. The display apparatus according to claim 1, wherein the mesh cell in the mesh distribution structure comprises a hollow structure.

8. The display apparatus according to claim 1, wherein a cross-sectional width of at least one connector among the plurality of connectors remains substantially same from at least one end of the respective connector toward a center of the respective connector.

9. The display apparatus according to claim 1, wherein the plurality of display units comprise at least one selected from the group consisting of organic light emitting diodes and quantum dot light emitting diodes.

10. The display apparatus according to claim 1, wherein at least one of the plurality of display units has a square shape; and wherein each side of the square shape is parallel to a row direction or a column direction of the rectangular array respectively.

11. The display apparatus according to claim 1, wherein at least one of the plurality of display units has a square shape; and wherein each side of the square shape is tilted at an angle with respect to a row direction or a column direction of the rectangular array respectively.

12. The display apparatus according to claim 1, wherein at least one of the plurality of the display units has a circular shape.

13. A method of fabricating the display apparatus according to claim 1, comprising:

providing a substrate; and forming the plurality of display units and the plurality of connectors connecting the plurality of the display units to one another in accordance with the mesh distribution structure on the substrate.

14. The method according to claim 13, wherein the forming the plurality of the display units and the plurality of connectors comprises:

forming thin film transistors of the plurality of display units and signal lines connecting the thin film transistors in accordance with the mesh distribution structure on the substrate;

etching or laser cutting the substrate to form a plurality of mesh cells in the mesh distribution structure; and forming a light-emitting layer on each of the thin film transistors.

15. The method according to claim 14, wherein the display units and the connectors are formed by etching or laser cutting the same substrate or the display units and the connectors are formed independently and then connected to each other after being formed.

16. A display apparatus, comprising:

a plurality of display units, each of the plurality of display units including at least one pixel; and a plurality of connectors that connect the plurality of display units to one another, wherein the plurality of connectors and the plurality of display units form a mesh distribution structure, the mesh distribution structure is configured to expand in a second direction perpendicular to the first direction in response that the mesh distribution structure is stretched in a first direction; and a cross-sectional width of at least one connector among the plurality of connectors gradually decreases from at least one end of the respective connector toward a center of the respective connector.

17. The display apparatus according to claim 16, wherein a connecting portion of the at least one end of the connector to the display unit forms a circular arc.

* * * * *